(12) United States Patent
Stein et al.

(10) Patent No.: US 7,692,204 B2
(45) Date of Patent: Apr. 6, 2010

(54) RADIATION EMITTING SEMI-CONDUCTOR ELEMENT

(75) Inventors: Wilhelm Stein, Lindau (DE); Reiner Windisch, Regensburg (DE); Ralph Wirth, Pettendorf-Adlersberg (DE); Ines Pietzonka, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 10/567,883

(22) PCT Filed: Jul. 30, 2004

(86) PCT No.: PCT/DE2004/001708

§ 371 (c)(1),
(2), (4) Date: Aug. 14, 2006

(87) PCT Pub. No.: WO2005/024961

PCT Pub. Date: Mar. 17, 2005

(65) Prior Publication Data

US 2007/0181894 A1    Aug. 9, 2007

(30) Foreign Application Priority Data

Aug. 29, 2003  (DE) ............................... 103 39 983
Oct. 7, 2003    (DE) ............................... 103 46 605

(51) Int. Cl.
*H01L 29/08* (2006.01)

(52) U.S. Cl. .......... 257/98; 257/E51.021; 257/E33.067; 257/E33.064; 257/E31.126; 257/449

(58) Field of Classification Search ....................... None
See application file for complete search history.

(56) References Cited

U.S. PATENT DOCUMENTS 5,115,286 A    5/1992   Camras et al.

(Continued)

FOREIGN PATENT DOCUMENTS

DE          19820777        11/1998

(Continued)

OTHER PUBLICATIONS

I. Schnitzer et al., "30% external quantum efficiency from surface textured, thin-film light-emitting diodes", *Appl. Phys. Lett.*, vol. 63, No. 16, pp. 2174-2176 (Oct. 18, 1993).

*Primary Examiner*—Minh-Loan T Tran
*Assistant Examiner*—Fei Fei Yeung Lopez
(74) *Attorney, Agent, or Firm*—Fish & Richardson P.C.

(57) ABSTRACT

A radiation-emitting semiconductor component with a semiconductor body, including a first principal surface (5), a second principal surface (9) and a semiconductor layer sequence (4) with an electromagnetic radiation generating active zone (7), in which the semiconductor layer sequence (4) is disposed between the first and the second principal surfaces (5, 9), a first current spreading layer (3) is disposed on the first principal surface (5) and electrically conductively connected to the semiconductor layer sequence (4), and a second current spreading layer (10) is disposed on the second principal surface (9) and electrically conductively connected to the semiconductor layer sequence (4).

39 Claims, 2 Drawing Sheets

U.S. PATENT DOCUMENTS

| | | | |
|---|---|---|---|
| 5,397,920 A * | 3/1995 | Tran | 257/749 |
| 5,861,636 A * | 1/1999 | Dutta et al. | 257/91 |
| 5,889,295 A * | 3/1999 | Rennie et al. | 257/96 |
| 5,977,565 A * | 11/1999 | Ishikawa et al. | 257/81 |
| 6,072,148 A * | 6/2000 | Azdasht | 219/121.63 |
| 6,271,050 B1 * | 8/2001 | Akiba et al. | 438/30 |
| 6,403,987 B1 | 6/2002 | Miki et al. | |
| 6,420,732 B1 | 7/2002 | Kung et al. | |
| 6,515,308 B1 * | 2/2003 | Kneissl et al. | 257/86 |
| 6,573,537 B1 * | 6/2003 | Steigerwald et al. | 257/103 |
| 6,614,056 B1 * | 9/2003 | Tarsa et al. | 257/91 |
| 6,657,236 B1 * | 12/2003 | Thibeault et al. | 257/98 |
| 6,847,056 B2 | 1/2005 | Noto et al. | |
| 6,878,563 B2 | 4/2005 | Bader et al. | |
| 2002/0043890 A1 * | 4/2002 | Lu et al. | 310/313 D |
| 2002/0074558 A1 | 6/2002 | Hata et al. | |
| 2002/0096687 A1 | 7/2002 | Kuo et al. | |
| 2002/0131462 A1 * | 9/2002 | Lin et al. | 372/43 |
| 2002/0137244 A1 * | 9/2002 | Chen et al. | 438/22 |
| 2002/0179918 A1 | 12/2002 | Sung et al. | |
| 2002/0190263 A1 * | 12/2002 | Hata et al. | 257/103 |
| 2003/0001249 A1 * | 1/2003 | Shimanuki | 257/678 |
| 2003/0003613 A1 | 1/2003 | Hsieh et al. | |
| 2003/0136442 A1 * | 7/2003 | Takamoto | 136/262 |
| 2003/0206741 A1 * | 11/2003 | Ledentsov et al. | 398/79 |
| 2003/0231683 A1 * | 12/2003 | Chua et al. | 372/46 |
| 2004/0046182 A1 * | 3/2004 | Chen et al. | 257/197 |
| 2004/0090779 A1 * | 5/2004 | Ou et al. | 362/231 |
| 2004/0104399 A1 | 6/2004 | Ou et al. | |
| 2004/0120375 A1 * | 6/2004 | Kwon | 372/45 |
| 2004/0211968 A1 * | 10/2004 | Lin et al. | 257/81 |
| 2005/0145870 A1 | 7/2005 | Shakuda et al. | |
| 2005/0158902 A1 * | 7/2005 | Chua et al. | 438/32 |
| 2005/0205875 A1 | 9/2005 | Shei et al. | |
| 2005/0207461 A1 | 9/2005 | Philippens et al. | |
| 2008/0073658 A1 | 3/2008 | Wirth | |

FOREIGN PATENT DOCUMENTS

| | | |
|---|---|---|
| DE | 10020464 | 11/2001 |
| DE | 102004004781 | 1/2004 |
| EP | 1 271665 | 1/2003 |
| EP | 1 403 935 | 3/2004 |
| JP | 2000-353820 | 12/2000 |
| WO | WO 01/41223 | 6/2001 |
| WO | WO 01/41225 | 6/2001 |
| WO | WO2002/061855 * | 8/2002 |

* cited by examiner

RADIATION EMITTING SEMI-CONDUCTOR ELEMENT

CROSS-REFERENCE TO RELATED APPLICATIONS

This application is the National Stage of International Application No. PCT/DE2004/001708, filed Jul. 30, 2004, which claims the benefit of German Patent Applications Serial No. 103 39 983.6, filed on Aug. 29, 2003, and Serial No. 103 46 605.3, filed on Oct. 7, 2003. The contents of all applications are hereby incorporated by reference in their entireties.

FIELD OF THE INVENTION

The invention concerns a radiation-emitting semiconductor component with a semiconductor body that includes a first principal surface, a second principal surface and a semiconductor layer sequence with an electromagnetic radiation generating active zone, the semiconductor layer sequence being disposed between the first and the second principal surfaces. The invention further concerns a method for producing such a radiation-emitting semiconductor component.

BACKGROUND OF THE INVENTION

In radiation-emitting semiconductor components, the internal conversion efficiency of electrical energy into radiant energy is usually much higher than the overall efficiency. This is due essentially to the low outcoupling efficiency from the semiconductor component of the radiation generated in the active zone. There are a number of reasons for this. It is frequently desired for current to be injected into the semiconductor layer sequence over a large area, which can be achieved for example by means of large-area metal contact structures. However, such contact structures usually are not transparent to the generated radiation and cause high absorption thereof.

There are also ways to inject current over a large area using small-area contact structures that do not cover the semiconductor body completely. For this purpose, the radiation-emitting semiconductor component can, for example, comprise so-called current spreading layers, which provide uniform current injection into the active zone. This can be achieved, on the one hand, by means of layers of doped semiconductor material disposed in the semiconductor layer sequence. Such layers must be relatively thick to ensure uniform current injection into the active zone. The thicker the semiconductor layer, however, the greater the amount of time needed to make the layer sequence. Furthermore, as the layer thickness increases, so does the absorption of free charge carriers and/or of the generated radiation in these layers, resulting in low overall efficiency.

In addition, known from JP 2000-353820 is a component having a current spreading layer that is transparent to the generated radiation. This layer contains ZnO, which belongs to the TCO (Transparent Conducting Oxides) class of materials. In addition to ZnO, ITO (Indium Tin Oxide) is another material from this class that is commonly used for current spreading.

The outcoupling efficiency is further limited by the total reflection of radiation generated in the active zone from interfaces, owing to the different refractive indexes of the semiconductor material and the surrounding material. Total reflection can be disturbed by suitable structuring of the interfaces. This results in a higher outcoupling efficiency.

Another cause of low outcoupling efficiency is absorption of the radiation in a substrate or a carrier on which the semiconductor layer sequence is grown or the radiation-emitting semiconductor component is mounted.

SUMMARY OF THE INVENTION

The object of the present invention is to develop a radiation-emitting semiconductor component of the kind recited at the beginning hereof that has an enhanced overall efficiency. A method for producing radiation-emitting semiconductor components of enhanced overall efficiency is also to be specified.

This object is achieved by means of a radiation-emitting semiconductor component having the features of Claim 1 and a method for producing radiation-emitting semiconductor components according to Claim 34. Advantageous improvements of the invention as the subject matter of the dependent claims.

A radiation-emitting semiconductor component according to the present invention comprises a semiconductor body including a first principal surface, a second principal surface and a semiconductor layer sequence with an electromagnetic radiation generating active zone, in which the semiconductor layer sequence is disposed between the first and the second principal surfaces, a first current spreading layer is disposed on the first principal surface and electrically conductively connected to the semiconductor layer sequence, and a second current spreading layer is disposed on the second principal surface and electrically conductively connected to the semiconductor layer sequence.

At least one of these current spreading layers preferably also contains electrically conductive materials that are transparent to the generated radiation. Particularly preferably, both current spreading layers contain such materials, particularly radiation-transparent conductive oxides, preferably metal oxides, such as for example ZnO, InO and/or SnO or oxides having two or more metallic constituents, such as ITO. Current spreading layers made from these materials are especially suitable, since, among other things, they have a low layer resistance that ensures uniform current entry into the semiconductor layer sequence. In addition, they exhibit broad ranges of high-transmission wavelengths. The resistances are advantageously below $200\Omega/\square$, values of less than $30\Omega/\square$ being particularly preferred. The unit $\Omega/\square$(ohms per square) in this context corresponds to the resistance of a square area of the layer.

The thicknesses of the current spreading layers are so selected according to the invention as to bring about uniform current entry into the semiconductor layer sequence. This is achieved with layer thicknesses of 10 nm to 1000 nm, particularly preferably of 200 nm to 800 nm.

At least one of the radiation-transparent, conductive current spreading layers advantageously contains Al, Ga, In, Ce, Sb and/or F as dopant(s) in order to reduce the layer resistance of the current spreading layers. For example, the first current spreading layer contains ZnO and is doped with Al, and the second current spreading layer contains SnO and is doped with Sb.

The current spreading layer can be applied for example by sputtering, particularly DC sputtering, the process parameters being so selected that an electrical contact is formed between the current spreading layer and the adjacent semiconductor layers that permits uniform current entry into the semiconductor layer sequence and thus into the active zone. The electrical contact between these layers can be further improved for example by sintering or suitable precleaning of the relevant surfaces of the layers involved. Due to the presence of two current spreading layers, the current is injected very uniformly on both sides of the semiconductor layer sequence and a high-quality active zone is formed, which is distinguished by evenly distributed radiation generation and advantageously low absorption.

In a preferred configuration of the invention, disposed on at least one of the current spreading layers is a mirror layer, which is preferably electrically conductive and, further, has a high reflectivity for the radiation generated in the active zone.

The mirror layer reduces absorption losses in any layers disposed under it, such as for example a substrate or a carrier, and forms with the current spreading layer a high-efficiency electrical mirror contact for contacting the semiconductor component. The mirror layer preferably contains a metal, advantageously Au, Ag, Al, Pt and/or an alloy containing at least one of these materials. The mirror layer is particularly preferably disposed on that side of the current spreading layer on the first principal surface that faces away from the semiconductor layer sequence. The mirror layer can be applied for example by vapor deposition or sputtering.

In a further preferred configuration of the invention, at least one principal surface of the semiconductor layer sequence has a microstructure that was built into or applied to the corresponding principal surface prior to the application of the current spreading layer. Said microstructure is fashioned such that the structured surface, compared to unstructured ones, has an enhanced outcoupling efficiency due to the disturbed total reflection of radiation generated in the active zone and incident on that surface. This increases the radiation outcoupling and thus the overall efficiency of the radiation-emitting semiconductor component. Such microstructures can be produced for example by roughening processes such as etching or grinding. In addition, such a microstructure can be produced by applying to the surface to be structured a metallic mask material whose wetting properties are such that small metallic islands, which are preferably at least partially linked, are formed on the surface. This island structure can be transferred to the to-be-structured surface by a dry etching process, after which the mask material can be removed by suitable methods. The principal surface on the side of the semiconductor layer sequence facing away from the mirror layer preferably has a microstructure.

In an advantageous improvement of the invention, the semiconductor layer sequence has at least one n- and one p-conductive layer. The thicknesses of the n- and/or p-conductive layers are typically between a monolayer and 1000 nm. The thickness of at least one or both of these layers is preferably less than 400 nm, and particularly preferably is between 150 nm and 350 nm. In conventional components, the n- and/or p-conductive layers disposed around the active zone often also serve to spread current and therefore have a relatively large thickness.

In the invention, however, current spreading takes place in the current spreading layers located outside of the semiconductor body. The layers of the semiconductor layer sequence can therefore be made relatively thin.

A semiconductor layer sequence with such advantageously small layer thicknesses positively affects the operation of the radiation-emitting semiconductor component in a variety of ways. For example, free charge carrier absorption, absorption of the generated radiation and the epitaxy times needed to make such components are substantially reduced, thereby increasing the outcoupling efficiency of the radiation-emitting semiconductor component, shortening production times for the semiconductor layer sequence and lowering its production cost.

The semiconductor layer sequence with the n- and p-conductive layers and a radiation generating active zone is preferably produced by epitaxial growth on a substrate, for example a GaAs substrate. The current spreading layers are preferably applied, for example by sputtering, after the epitaxy phase.

The semiconductor layer sequence preferably contains a III/V semiconductor, such as for example $In_xGa_yAl_{1-x-y}P$, where $0 \leq x \leq 1$, $0 \leq y \leq 1$ and $x+y \leq 1$, $In_xGa_yAl_{1-x-y}N$, where $0 \leq x \leq 1$, $0 \leq y \leq 1$ and $x+y \leq 1$, or $In_xGa_yAl_{1-x-y}As$, where $0 \leq x \leq 1$, $0 \leq y \leq 1$ and $x+y \leq 1$.

With particular advantage, the current spreading layer disposed on the p-conductive side of the semiconductor layer sequence contains ZnO, preferably doped with Al, and the one disposed on the n-conductive side SnO, preferably doped with Sb. In III/V semiconductors, Sn, for example, can at the same time be used as a dopant in the n-conductive region. The diffusion of Sn atoms from an SnO-containing current spreading layer into an adjacent n-conductive layer therefore increases the majority charge carrier concentration in the n-conductive layer. This is especially true at the interface of the two layers. The conductive contact between such layers and thus current injection into the active zone are therefore improved. Similar considerations apply to Zn as an acceptor in relation to p-conductive layers.

The first current spreading layer can therefore be different from the second current spreading layer, so that, depending on the contact properties, the material of the current spreading layer concerned can advantageously be adapted to the adjacent material of the semiconductor body.

In an advantageous improvement of the invention, when the radiation-emitting semiconductor component is in operation the first and/or second current spreading layer forms an electrical contact to the semiconductor body that has an ohmic characteristic (ohmic contact). Such a contact preferably has at least approximately a linear current-voltage characteristic within the range of the currents or voltages that occur during the operation of the radiation-emitting semiconductor component.

The current spreading layer disposed on the p-conductive side of the semiconductor body preferably forms an ohmic contact to the semiconductor body. Particularly preferably, a p-conductive, AlGaAs-containing layer of the semiconductor body adjoins a ZnO-containing current spreading layer. Such a combination has proven particularly advantageous for creating an ohmic contact.

In an advantageous configuration of the invention, the semiconductor layer sequence is grown epitaxially on a substrate which is removed after the epitaxy process by suitable measures, for example mechanical stressing or an etching operation. The semiconductor layer sequence is connected via the first principal surface to a carrier, made for example of GaAs. The connection is preferably electrically conductive and can be produced for example by means of a solder metallization. Disposed between the carrier and the first principal surface is a current spreading layer, on whose side facing away from the semiconductor layer sequence there is a mirror layer. The two advantageous improvements that follow are based hereon.

In a first advantageous improvement of the above configuration, the second principal surface, the one farther from the carrier, has a microstructure that disturbs the total reflection of radiation incident on that surface. Disposed on this principal surface is an additional current spreading layer, followed by a contact surface for electrically contacting the semiconductor component. The contact surface preferably has a smaller lateral extent than the semiconductor layer sequence and/or the current spreading layers. Furthermore, it can also comprise, on the side facing the semiconductor layer sequence, a layer that reflects radiation generated in the active zone, or it can itself be reflective. By means of the current spreading layers, the current injected through the contact surface is uniformly distributed laterally and is injected into the active zone over a large area. This prevents a disadvantageous increase in the generation of radiation in the region of the active zone located below the absorptive contact surface. Hence, absorption of the generated radiation in the contact surface is reduced by the reflecting layer, thereby increasing the outcoupling efficiency of the component.

In a second advantageous improvement of the above configuration, the second principal surface, the one farther from the carrier, has a microstructure. Disposed thereafter is a jacket layer that is transparent to the generated radiation, or a jacket layer sequence composed of plural layers and provided with the second current spreading layer. This current spreading layer has in this case at least one recess or window, so configured that the jacket layer sequence is not covered by the current spreading layer in the region of the recess or window. The recess is at least partially occupied by a contact surface for electrical contacting, which is in contact with the jacket layer sequence and the current spreading layer.

The contact surface is advantageously metallic and has with respect to the transition to the jacket layer sequence, in the case of a voltage applied in the forward direction, a potential barrier (e.g. a Schottky barrier) that is so high that nearly all of the current from the contact surface passes into the laterally adjacent current spreading layer and from there through the jacket layer into the active zone. As a result, only a very small fraction of current finds its way into the region of the active zone located below the contact surface, and only a very small amount of radiation is generated in that region compared to the rest of the active zone. Absorption of the generated radiation in the contact surface is thereby reduced. Moreover, a microstructure or a jacket layer (sequence) of the aforesaid kind can also be formed on the side of the semiconductor layer sequence facing the carrier.

An inventive production method for a radiation-emitting semiconductor component with a semiconductor body that includes a first principal surface, a second principal surface and a semiconductor layer sequence with an electromagnetic radiation generating active zone, the semiconductor layer sequence being disposed between the first and the second principal surfaces, comprises the following steps:

growing the semiconductor layer sequence on a substrate;
applying a radiation-transparent current spreading layer to the first principal surface;
stripping off the substrate;
applying a radiation-transparent current spreading layer to the second principal surface.

The above enumeration of the steps is not to be construed as fixing them in a given order.

The semiconductor layer sequence is preferably grown epitaxially. The substrate can be removed by a suitable method, such as for example an etching process or mechanical stressing. The current spreading layers preferably contain a TCO, particularly preferably ZnO and/or SnO.

To decrease the layer resistance, it is advantageous to dope at least one current spreading layer with Al, Ga, In, Ce, Sb and/or F.

Further configurations of the delineated method will emerge from the steps described below, which can be integrated into the above method at an appropriate point. In particular, many steps can be performed on both sides of the semiconductor layer sequence.

In a preferred configuration of the method, a mirror layer, preferably containing Au, Ag, Al, Pt and/or an alloy containing at least one of these materials, is applied to the current spreading layer on the first principal surface.

The semiconductor body can thereafter be affixed to a carrier, preferably over the mirror layer, the fixing preferably being effected by means of a solder metallization. The substrate is preferably stripped away after the semiconductor body is affixed to the carrier. The carrier can therefore be different from the substrate.

In addition, at least one principal surface can be provided with a microstructure to disturb the total reflection from this principal surface of the radiation generated in the active zone.

Furthermore, in an additional preferred configuration of the method, a jacket layer or a jacket layer sequence is applied, disposed between a current spreading layer and the semiconductor layer sequence. In the current spreading layer nearest the jacket layer a recess can be made, which is preferably occupied at least partially by a contact surface for electrically contacting the radiation-emitting semiconductor component. The recess is preferably so formed that the current spreading layer is completely removed in the region of the recess.

If no recess is provided, a contact surface can be applied to the current spreading layer that is farther from the carrier.

Particularly preferably, the outlined method is used to produce the semiconductor components described above.

BRIEF DESCRIPTION OF THE DRAWINGS

Further features, advantages and suitabilities of the invention will emerge from the descriptions of the following exemplary embodiments in connection with the following figures.

Like and like-acting elements have the same reference numerals in the figures.

DETAILED DESCRIPTION OF THE PREFERRED EMBODIMENTS

Figure 1:
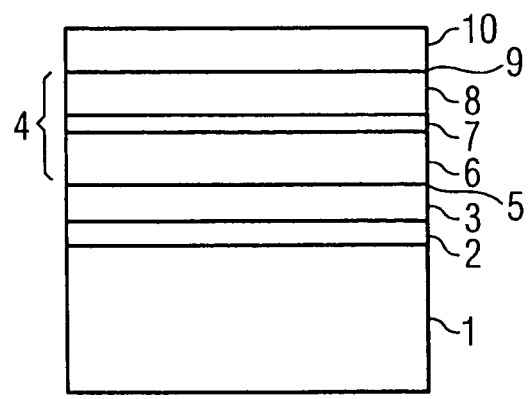
FIG. 1 shows a schematic sectional view of a first exemplary embodiment of an inventive radiation-emitting semiconductor component.

FIG. 1 is a schematic sectional view of a first exemplary embodiment of an inventive radiation-emitting semiconductor component. Disposed on a GaAs carrier 1 is a mirror layer 2 made of Au, and, thereon, a first current spreading layer 3 containing ZnO and Al, for example of the composition $Al_{0.02}Zn_{0.98}O$. These layers are followed by a semiconductor body comprising a semiconductor layer sequence 4 containing $In_xGa_yAl_{1-x-y}P$ where $0 \leq x \leq 1$, $0 \leq y \leq 1$ and $x+y \leq 1$. Semiconductor layer sequence 4 comprises a first principal surface 5, one or more semiconductor layers of a first conduction type 6, a radiation generating active zone 7, one or more semiconductor layers of a second conduction type 8, and a second principal surface 9. Disposed on second principal surface 9 is a second current spreading layer 10 containing SnO and Sb, for example of the composition $Sb_{0.2}Sn_{0.98}O$. Layers 6 and 8 are p- or n-conductive, respectively, and each has a total layer thickness of, for example, 200 nm.

Semiconductor layer sequence 4 is produced by epitaxy on a GaAs growth substrate, which is stripped away after the application of mirror layer 2. The combination of mirror layer 2 and current spreading layer 3 serves as a high-efficiency mirror contact for uniform current injection into semiconductor layer sequence 4. This reduces the absorption of radiation in the carrier 1, and, in combination with second current spreading layer 10 on second principal surface 9, ensures very uniform current entry through both principal surfaces 5 and 9 into semiconductor layer sequence 4 and particularly into active zone 7. The result, therefore, is a high-quality active zone 7 in which radiation is generated laterally uniformly.

The low layer thicknesses of semiconductor layers 6 and 8 permit a shorter production process for the semiconductor body and reduce the absorption of free charge carriers and of the generated radiation in these layers. The layer thicknesses are subject to a lower limit in that they are intended to prevent the diffusion of foreign atoms from the adjacent current spreading layers into the active region, their thickness must be large enough for the potential construction or application of a microstructure, and/or the charge carriers should remain in the active zone for as long as possible.

The combination of two current spreading layers 3 and 10 brings about an increase in overall efficiency, which is increased still further by the mirror layer 2 and the thin layers of different conduction types 6 and 8.

The element of semiconductor layer(s) 6 that adjoins current spreading layer 3 is preferably a p-conductive AlGaAs layer. The AlGaAs layer is advantageously integrated into the semiconductor body or semiconductor layer sequence. This simplifies the formation of a substantially ohmic contact between the current spreading layer and the semiconductor body.

The electrical contacting of the component can be effected via a contact surface disposed on the side comprising second principal surface 9 or second current spreading layer 10 and an opposite contact surface disposed on the side of carrier 1 opposite to the semiconductor body. This is not illustrated in FIG. 1.

Figure 2:
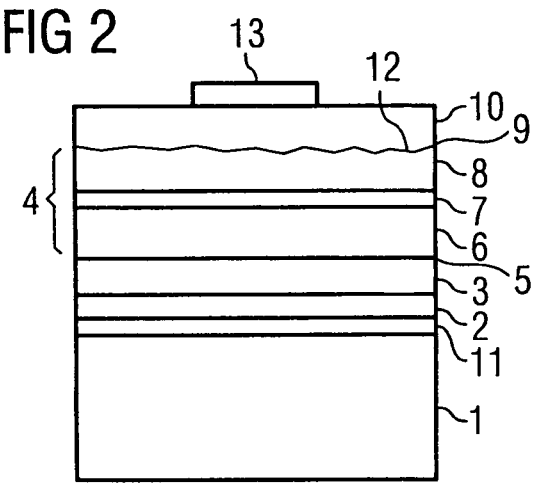
FIG. 2 shows a schematic sectional view of a second exemplary embodiment of an inventive radiation-emitting semiconductor component.

FIG. 2 shows a schematic sectional view of a second exemplary embodiment of an inventive radiation-emitting semiconductor component, which is substantially consistent with the construction sketched in FIG. 1. By contrast thereto, the mirror layer 2 is affixed to the carrier via a solder metallization 11 and is therefore electrically conductively connected to it. In addition, second principal surface 9 is provided with a microstructure 12, produced for example by means of a mask layer using the above-mentioned process. This disturbs total reflection and thereby increases outcoupling efficiency.

Moreover, disposed on second current spreading layer 10 is a contact surface 13 for electrical contacting, which on its side facing semiconductor layer sequence 4 can be reflective (not explicitly illustrated) with respect to the radiation generated in the active zone 7. Contact surface 13 has a smaller lateral extent than current spreading layers 3, 10 and/or semiconductor layer sequence 4. Absorption of the generated radiation in contact surface 13 is reduced due to the fact that increased radiation generation is prevented in the region of active zone 7 that is shaded by the absorptive contact surface 13. Mirror-coating the underside of contact surface 13 further helps to reduce absorption in contact surface 13. On the whole, therefore, the outcoupling efficiency is increased further in comparison to the exemplary embodiment depicted in FIG. 1.

Figure 3:
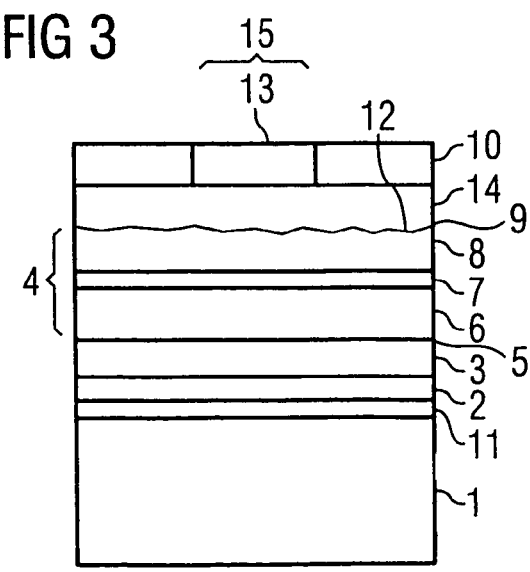
FIG. 3 shows a schematic sectional view of a third exemplary embodiment of an inventive radiation-emitting semiconductor component.

FIG. 3 is a schematic sectional view of a third exemplary embodiment of an inventive radiation-emitting semiconductor component. The basic construction, again, is that shown in FIG. 2. By contrast thereto, a jacket layer 14 is disposed between current spreading layer 10 and second principal surface 9. In addition, the electrical contacting is effected through a contact surface 13 that is disposed in a recess 15 in current spreading layer 10 and is in direct contact with current spreading layer 10 and electrically conductive jacket layer 14. The electrical contacts between these layers are produced such that the current from contact surface 13 flows primarily through current spreading layer 10 and then jacket layer 14 into semiconductor layer sequence 4 and active zone 7. The contact between jacket layer 14 and contact surface 13 here comprises a sufficiently high potential barrier (for example a Schottky barrier) to prevent current from flowing directly from contact surface 13 through jacket layer 14 into semiconductor layer sequence 4, or at least reduces the flow of current over this path.

Jacket layer 14 is preferably transparent to the generated radiation and contains for example $Al_xGa_{1-x}As_yP_{1-x-y}$, where $0 \leq x \leq 1$ and $0 \leq y \leq 1$. Such contacting causes a smaller fraction of current, compared to the exemplary embodiment of FIG. 2, to be injected into the region of active zone 7 shaded by contact surface 13. The radiant output generated in that region is therefore relatively low, and thus only a correspondingly small amount of radiation is absorbed in contact surface 13. The outcoupling efficiency is thereby increased further in comparison to the subject matter depicted in FIG. 2.

FIGS. 4a to 4d provide a schematic diagram of an exemplary embodiment of an inventive method for producing a radiation-emitting semiconductor component of high overall efficiency, based on four intermediate steps.

Figure 4A:
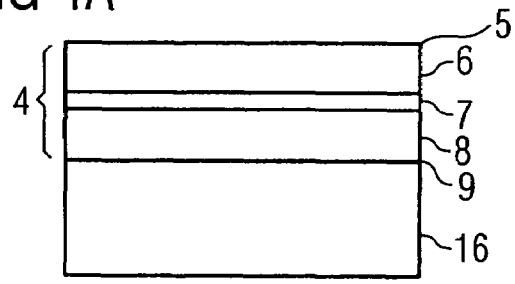
FIG. 4 provides, in FIGS. 4A to 4D, a schematic diagram of an exemplary embodiment of an inventive method for producing a radiation-emitting semiconductor component, based on four intermediate steps.

FIG. 4a depicts a semiconductor layer sequence 4 that has been grown epitaxially on a substrate 16, made for example of GaAs. The semiconductor layer sequence 4 forms a semiconductor body that includes a first principal surface 5, a layer of a first conduction type 6 (e.g. p-conductive), an electromagnetic radiation generating active zone 7, a layer of a second conduction type 8 (e.g. n-conductive) and a second principal surface 9. Layers 6 and 8 are each 200 nm thick. The semiconductor layer sequence 4 is based for example on $In_xGa_y-Al_{1-x-y}P$, where $0 \leq x \leq 1$, $0 \leq y \leq 1$ and $x+y \leq 1$.

Figure 4B:
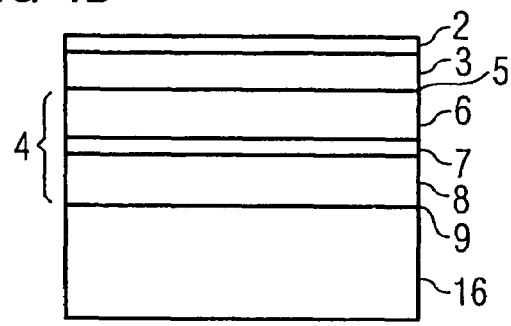
Figure 4C:
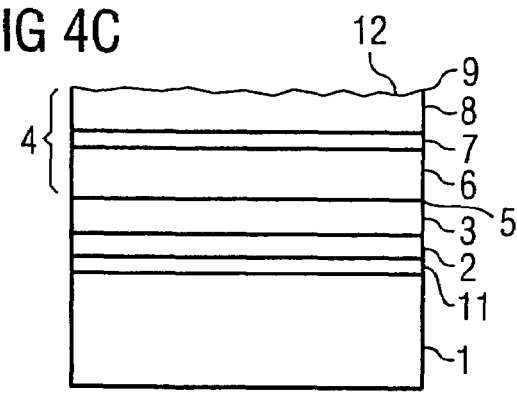

In FIG. 4b, a current spreading layer 3 made from $Al_{0.02}Zn_{0.98}O$ is sputtered onto first principal surface 5. It is then provided by vapor deposition or sputtering with a mirror layer 2 made of Au. Next, as shown in FIG. 4c, mirror layer 2 is affixed by means of a solder metallization 11 to a carrier 1, preferably of GaAs, and the substrate 16 is removed, mirror layer 2 being connected electrically conductively to the carrier 1. Furthermore, in second principal surface 9, which now is no longer connected to the substrate 16, a microstructure 12 that disturbs total reflection from that surface is applied or built in a suitable manner. Carrier 1 is therefore different in particular from substrate 16.

Figure 4D:
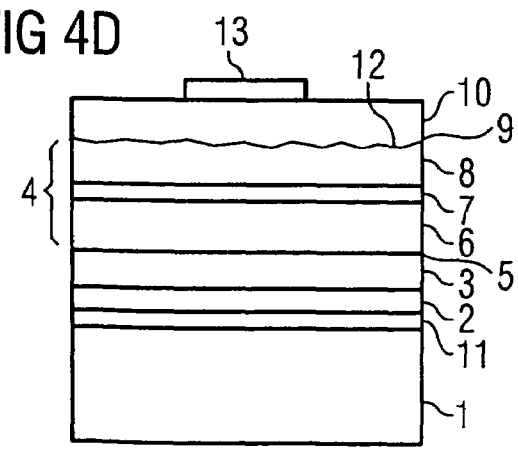

An additional current spreading layer 10 containing $Sb_{0.02}Sn_{0.98}O$ is then sputtered onto principal surface 9 comprising microstructure 12, and in FIG. 4d, in a last method step, is provided with a contact surface 13 for electrically contacting the radiation-emitting semiconductor component.

The invention is not limited by the description based on the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:
1. A radiation-emitting semiconductor component comprising:

a semiconductor body that includes a first principal surface, a second principal surface and an epitaxially formed semiconductor layer sequence with an electromagnetic radiation generating active zone, said epitaxially formed semiconductor layer sequence forming the semiconductor body and being disposed between the first and the second principal surfaces;

a carrier supporting the semiconductor body;

a first non-epitaxially formed current spreading layer disposed on said first principal surface and positioned between the semiconductor body and the carrier, and electrically conductively connected to said semiconductor layer sequence;

a second non-epitaxially formed current spreading layer disposed on said second principal surface and electrically conductively connected to said semiconductor layer sequence; and a mirror layer disposed on a side of the first current spreading layer that faces away from the semiconductor layer sequence, wherein the first current spreading layer comprises a first material and the second current spreading layer comprises a second material different from the first material and at least one of said two principal surfaces comprising said current spreading layers has a microstructure.

2. The radiation-emitting semiconductor component as in claim 1, wherein at least one of said current spreading layers contains a material that is transparent to the generated radiation.

3. The radiation-emitting semiconductor component as in claim 1, wherein both current spreading layers contain a material that is transparent to the generated radiation.

4. The radiation-emitting semiconductor component as in claim 2 wherein-said radiation-transparent material contains an oxide.

5. The radiation-emitting semiconductor component as in claim 4, wherein said oxide is a metal oxide.

6. The radiation-emitting semiconductor component as in claim 2, wherein said radiation-transparent material contains ITO and/or InO.

7. The radiation-emitting semiconductor component as in claim 2, wherein-said radiation-transparent material contains ZnO.

8. The radiation-emitting semiconductor component as in claim 2, wherein said radiation-transparent material contains SnO.

9. The radiation-emitting semiconductor component as in claim 1, wherein at least one of said current spreading layers contains Al, Ga, In, Ce, Sb and/or F.

10. A radiation-emitting semiconductor component comprising:

a semiconductor body that includes a first principal surface, a second principal surface and an epitaxially formed semiconductor layer sequence with an electromagnetic radiation generating active zone, said epitaxially formed semiconductor layer sequence forming the semiconductor body and being disposed between the first and the second principal surfaces;

a carrier supporting the semiconductor body;

a first non-epitaxially formed current spreading layer disposed on said first principal surface and positioned between the semiconductor body and the carrier, and electrically conductively connected to said semiconductor layer sequence;

a second non-epitaxially formed current spreading layer disposed on said second principal surface and electrically conductively connected to said semiconductor layer sequence; and a mirror layer disposed on a side of the first current spreading layer that faces away from the semiconductor layer sequence, wherein the first current spreading layer comprises a first material and the second current spreading layer comprises a second material different from the first material, and said mirror layer is electrically conductive.

11. The radiation-emitting semiconductor component as in claim 10 wherein said mirror layer contains a metal.

12. The radiation-emitting semiconductor component as in claim 10 wherein said mirror layer contains Au, Ag, Al and/or Pt.

13. The radiation-emitting semiconductor component as in claim 10 wherein said principal surface has a microstructure on the side of said semiconductor layer sequence facing away from said mirror layer.

14. The radiation-emitting semiconductor component as in claim 1, wherein said semiconductor layer sequence contains at least one n- and/or p-conductive layer.

15. The radiation-emitting semiconductor component as in claim 14, wherein the thickness of said n-conductive and/or said p-conductive layer is in the range of a monolayer to 1000 nm.

16. The radiation-emitting semiconductor component as in claim 14 wherein the current spreading layer on the side comprising the p-conductive layer of the semiconductor layer sequence contains ZnO.

17. The radiation-emitting semiconductor component as in claim 14, wherein the current spreading layer on the side comprising the n-conductive layer of the semiconductor layer sequence contains SnO.

18. The radiation-emitting semiconductor component as in claim 1, wherein said carrier contains GaAs.

19. The radiation-emitting semiconductor component as in claim 1, wherein said radiation-emitting semiconductor component is affixed to said carrier by means of a solder metallization.

20. The radiation-emitting semiconductor component as in claim 1, wherein a solder metallization is disposed on said mirror layer to affix said radiation-emitting semiconductor component to said carrier.

21. The radiation-emitting semiconductor component as in claim 1, wherein disposed on at least one of the first current spreading layer and the second current spreading layer is a contact surface for electrical contacting.

22. The radiation-emitting semiconductor component as in claim 21, wherein said contact surface is disposed on the side of said semiconductor layer sequence opposite to said carrier.

23. The radiation-emitting semiconductor component as in claim 21, wherein said contact surface has on the side facing said semiconductor layer sequence a layer that reflects the generated radiation.

24. The radiation-emitting semiconductor component as in claim 1, wherein at least one of said current spreading layers comprises a recess.

25. The radiation-emitting semiconductor component as in claim 24, wherein disposed in said recess is an electrically conductive contact surface.

26. The radiation-emitting semiconductor component as in claim 25, wherein the electrical contacting of said radiation-emitting semiconductor component takes place via said contact surface.

27. The radiation-emitting semiconductor component as in claim 26, wherein disposed on the side of said current spreading layer facing said semiconductor layer sequence and provided with said recess and said contact surface is a jacket layer or a jacket layer sequence.

28. The radiation-emitting semiconductor component as in claim 27, wherein said jacket layer or jacket layer sequence is poorly electrically conductive with respect to said contact surface, such that the current partially flows into said current spreading layer.

29. The radiation-emitting semiconductor component as in claim 1, wherein said semiconductor layer sequence contains a III/V semiconductor, preferably $In_xGa_yAl_{1-x-y}P$, where $0 \leq x \leq 1$, $0 \leq y \leq 1$ and $x+y \leq 1$, $In_xGa_yAl_{1-x-y}N$, where $0 \leq x \leq 1$, $0 \leq y \leq 1$ and $x+y \leq 1$, or $In_xGa_yAl_{1-x-y}As$, where $0 \leq x \leq 1$, $0 \leq y \leq 1$ and $x+y \leq 1$.

30. The radiation-emitting semiconductor component as in claim 1, wherein said first current spreading layer contains ZnO and on the side nearest said semiconductor body adjoins a p-conductive AlGaAs-containing layer.

31. The radiation-emitting semiconductor component as in claim 15, wherein the thickness of said n-conductive and/or said p-conductive layer is less than 400 nm.

32. The radiation-emitting semiconductor component as in claim 31, wherein the thickness of said n-conductive and/or said p-conductive layer is between 150 nm and 400 nm.

33. The radiation-emitting semiconductor component as in claim 14, wherein the current spreading layer on the side comprising the n-conductive layer of the semiconductor layer sequence contains SnO and Sb.

34. The radiation-emitting semiconductor component as in claim 1, wherein the first current spreading layer and the second current spreading layer contain an oxide.

35. The radiation-emitting semiconductor component as in claim 1, wherein the first current spreading layer and the second current spreading layer are sputtered layers.

36. The radiation-emitting semiconductor component as in claim 1 comprising a lattice mismatch at the first principal surface between the epitaxially formed semiconductor layer sequence and the first non-epitaxially formed current spreading layer, and further comprising a lattice mismatch at the second principal surface between the epitaxially formed semiconductor layer sequence and the second non-epitaxially formed current spreading layer.

37. A radiation-emitting semiconductor component comprising:
a semiconductor body that includes a first principal surface, a second principal surface and an epitaxially formed semiconductor layer sequence with an electromagnetic radiation generating active zone, said epitaxially formed semiconductor layer sequence forming the semiconductor body and being disposed between the first and the second principal surfaces;
a carrier supporting the semiconductor body;
a first non-epitaxially formed metal oxide current spreading layer disposed on said first principal surface and positioned between the semiconductor body and the carrier, and electrically conductively connected to said semiconductor layer sequence;
a second non-epitaxially formed metal oxide current spreading layer disposed on said second principal surface and electrically conductively connected to said semiconductor layer sequence; and
a mirror layer disposed on a side of the first current spreading layer that faces away from the semiconductor layer sequence,
wherein the first current spreading layer comprises a first material and the second current spreading layer comprises a second material different from the first material.

38. The radiation-emitting semiconductor component as in claim 1, wherein the first current spreading layer contains ZnO and the second current spreading layer contains SnO.

39. The radiation-emitting semiconductor component as in claim 37, wherein the first current spreading layer contains ZnO and the second current spreading layer contains SnO.

* * * * *